United States Patent
Nagaya et al.

(10) Patent No.: US 10,753,978 B2
(45) Date of Patent: Aug. 25, 2020

(54) METHOD FOR TESTING ALL SOLID STATE BATTERY, METHOD FOR PRODUCING ALL SOLID STATE BATTERY, AND METHOD FOR PRODUCING BATTERY PACK

(71) Applicant: TOYOTA JIDOSHA KABUSHIKI KAISHA, Toyota-shi, Aichi-ken (JP)

(72) Inventors: Katsuhiko Nagaya, Toyota (JP); Masato Kamiya, Toyota (JP); Shinobu Okayama, Miyoshi (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 0 days.

(21) Appl. No.: 16/386,435

(22) Filed: Apr. 17, 2019

(65) Prior Publication Data

US 2019/0331736 A1 Oct. 31, 2019

(30) Foreign Application Priority Data

Apr. 27, 2018 (JP) .................................. 2018-086502

(51) Int. Cl.
*G01R 31/378* (2019.01)
*H01M 10/42* (2006.01)
(Continued)

(52) U.S. Cl.
CPC ......... *G01R 31/378* (2019.01); *G01R 31/367* (2019.01); *G01R 31/374* (2019.01); *H01M 10/0585* (2013.01); *H01M 10/4285* (2013.01)

(58) Field of Classification Search
CPC ...... H01M 10/44; H01M 10/04; H01M 4/139; H01M 10/4285; H01M 4/04;
(Continued)

(56) References Cited

U.S. PATENT DOCUMENTS

| | | | | |
|---|---|---|---|---|
| 9,257,721 | B2 * | 2/2016 | Baba | .................... H01M 10/052 |
| 2015/0048838 | A1 * | 2/2015 | Ose | ....................... G01R 31/382 |
| | | | | 324/430 |

FOREIGN PATENT DOCUMENTS

| | | |
|---|---|---|
| JP | 2001-110458 A | 4/2001 |
| JP | 2009-289757 A | 12/2009 |

(Continued)

OTHER PUBLICATIONS

Communication dated May 26, 2020, issued by the U.S. Patent and Trademark Office in U.S. Appl. No. 16/287,086.

*Primary Examiner* — Melissa J Koval
*Assistant Examiner* — Trung Nguyen
(74) *Attorney, Agent, or Firm* — Sughrue Mion, PLLC (57) ABSTRACT

A method for testing an all solid state battery with which the presence of short circuit or the presence of defect causing short circuit can be detected with high accuracy by a comparatively simple method in which a voltage is applied to a battery and the current value thereof is measured. The method comprising steps of: a resistance increasing step of increasing resistance of an all solid state battery to $3.2*10^8$ $\Omega \cdot cm^2$ or more: a voltage applying step of applying voltage to an all solid state battery of which the resistance is increased; and a judging step of judging acceptability of the all solid state battery based on a current value measured in the voltage applying step; and the voltage applying step includes a first voltage applying treatment of applying voltage Vi, a second voltage applying treatment of applying voltage V2 corresponding to the reverse voltage of the voltage Vi after the first voltage applying treatment, and a third voltage applying treatment of applying voltage V3 corresponding to the reverse voltage of the voltage V2 after the second voltage applying treatment; and in the judging step, acceptability of the all solid state battery is judged (Continued)

based on current value Ci and current value C3 measured when the voltage Vi and the voltage V3 are applied.

7 Claims, 3 Drawing Sheets

(51) Int. Cl.
*H01M 10/0585* (2010.01)
*G01R 31/367* (2019.01)
*G01R 31/374* (2019.01)

(58) Field of Classification Search
CPC ......... H01M 10/0525; H01M 10/0562; H01M 10/0565; H01M 10/0585; G01R 31/378; G01R 31/367
USPC ...... 324/200, 207.11–207.19, 219, 220, 233, 324/234, 239, 241, 425, 426, 427–437, 324/443–447, 500, 515, 529, 530, 750.06
See application file for complete search history.

(56) References Cited

FOREIGN PATENT DOCUMENTS

| | | |
|---|---|---|
| JP | 2015-8073 A | 1/2015 |
| JP | 2016-18704 A | 2/2016 |
| JP | 2016-207540 A | 12/2016 |
| KR | 10-2015-0050481 A | 5/2015 |

\* cited by examiner

METHOD FOR TESTING ALL SOLID STATE BATTERY, METHOD FOR PRODUCING ALL SOLID STATE BATTERY, AND METHOD FOR PRODUCING BATTERY PACK

TECHNICAL FIELD

The present disclosure relates to a method for testing an all solid state battery.

BACKGROUND ART

An all solid state battery is a battery including a solid electrolyte layer between a cathode active material layer and an anode active material layer, and one of the advantages thereof is that the simplification of a safety device may be more easily achieved compared to a liquid-based battery including a liquid electrolyte containing a flammable organic solvent.

Meanwhile, Patent Literature 1 discloses a method for detecting short circuit of a battery by applying voltage to a non-injected battery (battery before injecting a liquid electrolyte) provided with a cell comprising a cathode plate, an anode plate, and a separator, although the technique is not related to an all solid state battery.

CITATION LIST

Patent Literatures

Patent Literature 1: Japanese Patent Application Laid-Open (JP-A) No. 2001-110458

SUMMARY OF DISCLOSURE

Technical Problem

It is preferable to detect the presence of short circuit (including minute short circuit) or presence of a defect causing short circuit (such as a foreign substance) when an all solid state battery is produced. For example, in Patent Literature 1, a voltage is applied to a battery comprising a cathode plate, an anode plate, and a separator but not comprising a liquid electrolyte, and the current value thereof is measured to detect short circuit. However, it is difficult to simply apply this kind of detecting method to an all solid state battery due to characteristics of a solid electrolyte.

The present disclosure has been made in view of the above circumstances, and a main object thereof is to provide a method for testing an all solid state battery with which the presence of short circuit or the presence of defect causing short circuit can be detected with high accuracy by a comparatively simple method in which a voltage is applied to a battery and the current value thereof is measured.

Solution to Problem

In order to achieve the object, the present disclosure provides a method for testing an all solid state battery, the method comprising steps of: a resistance increasing step of increasing resistance of an all solid state battery to $3.2*10^8$ $\Omega \cdot cm^2$ or more; a voltage applying step of applying voltage to an all solid state battery of which the resistance is increased; and a judging step of judging acceptability of the all solid state battery based on a current value measured in the voltage applying step; and the voltage applying step includes a first voltage applying treatment of applying voltage $V_1$, a second voltage applying treatment of applying voltage $V_2$ corresponding to the reverse voltage of the voltage $V_1$ after the first voltage applying treatment, and a third voltage applying treatment of applying voltage $V_3$ corresponding to the reverse voltage of the voltage $V_2$ after the second voltage applying treatment; and in the judging step, acceptability of the all solid state battery is judged based on current value $C_1$ and current value $C_3$ measured when the voltage $V_1$ and the voltage $V_3$ are applied.

According to the present disclosure, the all solid state battery with the resistance increased to the specific value is used as a target of testing, and thus the presence of short circuit or the presence of a defect causing short circuit can be detected with high accuracy by a comparatively simple method in which a voltage is applied to a battery and the current value thereof is measured. Also, the second voltage applying treatment of applying the reverse voltage is conducted between the first voltage applying step and the third voltage applying step so as to further improve the detection accuracy.

In the disclosure, the resistance of the all solid state battery may be increased by a freezing treatment in the resistance increasing step.

The present disclosure also provides a method for testing an all solid state battery, the method comprising steps of: a resistance increasing step of increasing resistance of an all solid state battery by a freezing treatment; a voltage applying step of applying voltage to an all solid state battery of which the resistance is increased; and a judging step of judging acceptability of the all solid state battery based on a current value measured in the voltage applying step; and the voltage applying step includes a first voltage applying treatment of applying voltage $V_1$, a second voltage applying treatment of applying voltage $V_2$ corresponding to the reverse voltage of the voltage $V_1$ after the first voltage applying treatment, and a third voltage applying treatment of applying voltage $V_3$ corresponding to the reverse voltage of the voltage $V_2$ after the second voltage applying treatment; and in the judging step, acceptability of the all solid state battery is judged based on current value $C_1$ and current value $C_3$ measured when the voltage $V_1$ and the voltage $V_3$ are applied.

According to the present disclosure, the all solid state battery with the resistance increased by the freezing treatment is used as a target of testing, and thus the presence of short circuit or the presence of a defect causing short circuit can be detected with high accuracy by a comparatively simple method in which a voltage is applied to a battery and the current value thereof is measured. Also, the second voltage applying treatment of applying the reverse voltage is conducted between the first voltage applying step and the third voltage applying step so as to further improve the detection accuracy.

In the disclosure, the voltage $V_1$ and the voltage $V_2$ may satisfy $V_2 \leq -V_1/250$.

In the disclosure, the voltage $V_1$ and the voltage $V_3$ may satisfy $0.9V_1 \leq V_3 \leq 1.1V_1$.

The present disclosure also provides a method for testing an all solid state battery, the method comprising steps of: a preparing step of preparing an all solid state battery; and a testing step of testing the all solid state battery using the above described method for testing an all solid state battery.

According to the present disclosure, an all solid state battery is tested using the above described method and thus an all solid state battery with higher safety can be obtained.

The present disclosure also provides a method for producing a battery pack, the method comprising steps of: a preparing step of preparing an all solid state battery; a testing step of testing the all solid state battery using the method for testing an all solid state battery according to claim 1; and an assembling step of assembling a battery pack using a plurality of the all solid state battery judged acceptable in the testing step.

According to the present disclosure, the all solid state battery judged acceptable in the testing step is used, and thus a battery pack with higher safety can be obtained.

Advantageous Effects of Disclosure

The method for testing an all solid state battery of the present disclosure exhibits effects capable of detecting the presence of short circuit or the presence of defect causing short circuit can be detected with high accuracy by a comparatively simple method in which a voltage is applied to a battery and the current value thereof is measured.

DESCRIPTION OF EMBODIMENTS

The method for testing an all solid state battery, the method for producing an all solid state battery, and the method for producing a battery pack of the present disclosure are hereinafter explained in details.

A. Method for Testing all Solid State Battery

Figure 1:
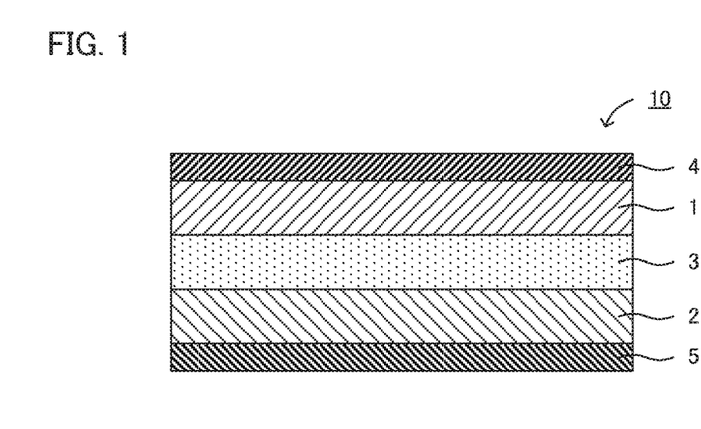
FIG. 1 is a schematic cross-sectional view illustrating an example of the all solid state battery in the present disclosure.

FIG. 1 is a schematic cross-sectional view illustrating an example of the all solid state battery in the present disclosure. All solid state battery 10 illustrated in FIG. 1 comprises cathode active material layer 1, anode active material layer 2, and solid electrolyte layer 3 formed between cathode active material layer 1 and anode active material layer 2. All solid state battery 10 further comprises cathode current collector 4 for collecting currents of cathode active material layer 1, and anode current collector 5 for collecting currents of anode active material layer 2.

Figure 2:
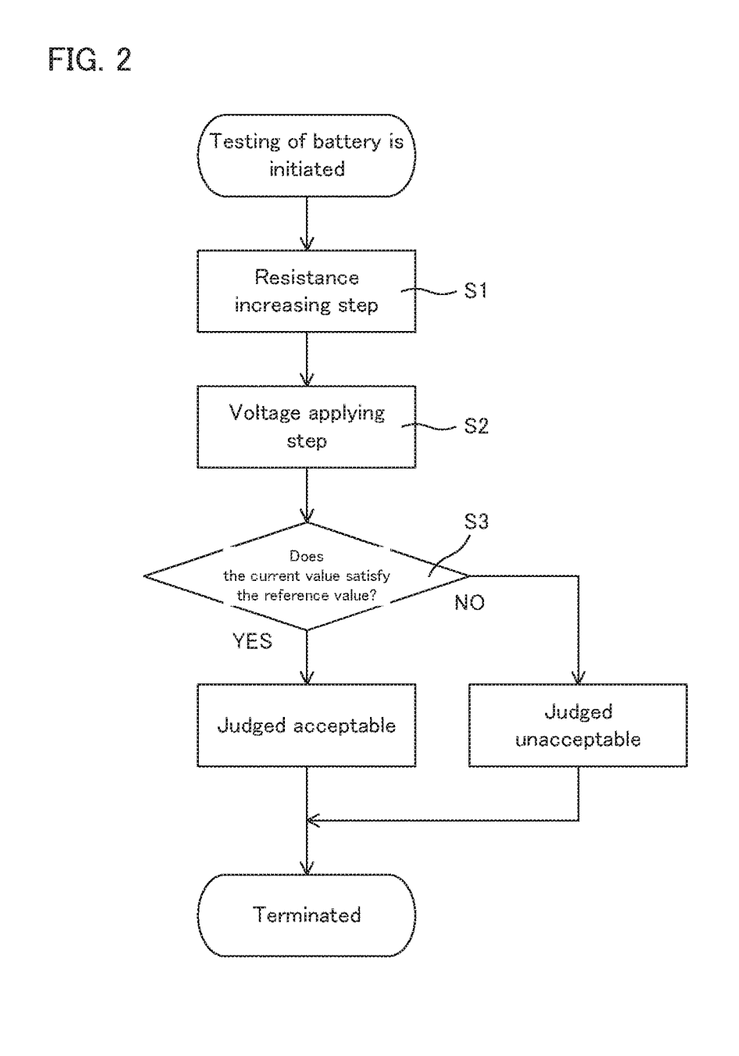
FIG. 2 is a flow chart explaining an example of the method for testing an all solid state battery of the present disclosure.

FIG. 2 is a flow chart explaining an example of the method for testing an all solid state battery of the present disclosure. When the method for testing an all solid state battery of the present disclosure is initiated, first, the resistance of the all solid state battery is increased (resistance increasing step, S1). The resistance of the all solid state battery is increased by a treatment such as a freezing treatment. Next, voltage is applied to the battery of which resistance is increased (voltage applying step, S2). On this occasion, the voltage applying step includes a first voltage applying treatment of applying voltage $V_1$, a second voltage applying treatment of applying voltage $V_2$ corresponding to the reverse voltage of the voltage $V_1$ after the first voltage applying treatment, and a third voltage applying treatment of applying voltage $V_3$ corresponding to the reverse voltage of the voltage $V_2$ after the second voltage applying treatment. Next, the currency caused when voltage $V_1$ and $V_3$ is applied is measured, and the acceptability of the all solid state battery is judged based on the current value $C_1$ and $C_3$ measured (judging step, S3). Thereby, the test is terminated.

According to the present disclosure, the all solid state battery with increased resistance is used as a target for testing, and thus the presence of short circuit or the presence of a defect causing short circuit can be detected with high accuracy by a comparatively simple method in which a voltage is applied to a battery and the current value thereof is measured. Also, the second voltage applying treatment of applying the reverse voltage is conducted between the first voltage applying step and the third voltage applying step so as to further improve the detection accuracy.

Here, if the number of the voltage applying treatment is simply increased for the purpose of improving the detection accuracy, a capacitance component would be accumulated in the all solid state battery per the voltage applying treatment to cause the increase in resistance. Accordingly, the current value measured in the voltage applying treatment would be small, which may be difficult to distinguish from the all solid state battery to be judged acceptable in some cases. In other words, when the number of the voltage applying treatment is simply increased, the detection accuracy may be degraded on contrary to the intention in some cases. To solve the problem, in the present disclosure, the second voltage applying treatment of applying the reverse voltage is conducted between the first voltage applying step and the third voltage applying step. Thereby, the capacitance component accumulated in the all solid state battery may be eliminated and the detection accuracy may be improved.

In the present disclosure, the presence of short circuit in a solid electrolyte layer (internal short circuit) can be detected with high accuracy. Also, the short circuit in the present disclosure includes a minute short circuit. The minute short circuit is referred to a slight short circuit where charge and discharge are possible although short circuit itself occurs. For example, the minute short circuit is easily caused when the insulating property of the solid electrolyte layer is low. Meanwhile, examples of the defect causing short circuit may include a foreign substance. For example, when a foreign substance is present inside or in the vicinity of the solid electrolyte layer, a crack is easily generated in the solid electrolyte layer, and short circuit easily occurs as the result.

As described above, in Patent Literature 1, a voltage is applied to a battery comprising a cathode plate, an anode plate, and a separator but not comprising a liquid electrolyte, and the current value thereof is measured to detect short circuit. However, it is difficult to simply apply this kind of detecting method to an all solid state battery due to characteristics of a solid electrolyte. The reasons therefor are as follows. Ions are not conducted between cathode and anode in a battery comprising a cathode, an anode, and a separator, but not comprising a liquid electrolyte. In other words, it is in a state not functioning as a battery, and thus the presence of short circuit can be easily detected by applying voltage between the cathode and the anode to measure the current value. On the other hand, the solid electrolyte layer in the all solid state battery has ion conductivity as well as insulating properties. In other words, the battery comprising a solid electrolyte layer is in a state functioning as a battery; thus, when voltage is applied between the cathode and anode, the charge of the all solid state battery is caused, and detection of the presence of short circuit is difficult even by measuring the current value. In this manner, it is difficult to simply apply the detecting method for a liquid-based battery to an all solid state battery.

To solve the problem, in the present disclosure, the resistance of the all solid state battery is increased by a treatment such as a freezing treatment. Thereby, the reaction occurs inside the battery may be inhibited. The presence of short circuit or the presence of defect causing short circuit can be detected with high accuracy by applying voltage between the cathode and anode of the battery that is in such a high resistance state to measure the current value.

1. Resistance Increasing Step

The resistance increasing step in the present disclosure is a step of increasing the resistance of an all solid state battery. In this step, the resistance of the all solid state battery may be, for example, increased to $1*10^5$ $\Omega \cdot cm^2$ or more, may be increased to $1*10^6$ $\Omega \cdot cm^2$ or more, may be increased to $1*10^7$ $\Omega \cdot cm^2$ or more, may be increased to $1*10^8$ $\Omega \cdot cm^2$ or more, may be increased to $3.2*10^8$ $\Omega \cdot cm^2$ or more. Incidentally, the resistance of the all solid battery is inversely proportional to the area; thus, in the present disclosure, it is specified as the resistance per unit area ($\Omega \cdot cm^2$). Also, the resistance of the all solid state battery may be determined by a method described in Examples later.

Also, the extent of increasing the resistance of the all solid battery varies with the purpose of a test. The higher the difficulty of the test is, the more of resistance of the all solid state battery is preferably increased. Examples of the purpose of the test may include short circuit detection, minute short circuit detection, and foreign substance detection. Also, examples of the foreign substance detection may include detection of a foreign substance that penetrates a solid electrolyte layer, detection of a foreign substance that does not penetrate a solid electrolyte layer, detection of a foreign substance included in a solid electrolyte layer, and detection of a foreign substance included in between a solid electrolyte layer and an electrode active material layer (a cathode active material layer or an anode active material layer).

In the present disclosure, the resistance of the all solid state battery is usually increased by a resistance increasing treatment. There are no particular limitations on the resistance increasing treatment, but is preferably a treatment with which the resistance of the all solid state battery can be increased to the extent not functioning as a battery. Also, the resistance increasing treatment is preferably a treatment of temporarily increasing the resistance of the all solid state battery. It means that it is preferably a treatment with which the resistance increased after the later described voltage applying step can be reduced.

An example of the resistance increasing treatment is a freezing treatment. In the freezing treatment, the temperature of the all solid state battery is lowered to inhibit or terminate the reactions that occur inside the battery as a whole, and thereby the resistance of the all solid state battery is increased. Incidentally, for example, when the freezing treatment is conducted to a liquid electrolyte, the battery is easily damaged since a volume change during freezing is large. On the other hand, one of the advantages of the all solid state battery is that the battery is not easily damaged since the volume change thereof during freezing is small.

In the present disclosure, by the freezing treatment, the temperature of the all solid state battery may be, for example, set to −45° C. or less, may be set to −90° C. or less, may be set to −100° C. or less, may be set to −120° C. or less, may be set to −135° C. or less, and may be set to −140° C. or less. There are no particular limitations on the method for freezing and examples thereof may include a method of bringing the all solid state battery into contact with a refrigerant. Examples of the refrigerant may include liquid helium, liquid nitrogen, liquid oxygen, and dry ice. Also, as the refrigerant, a general freezing mixture may be used.

An additional example of the resistance increasing treatment may include a treatment of reducing the confining pressure of the all solid state battery. A confining pressure is usually applied to the all solid state battery to reduce the battery resistance. The resistance of the all solid state battery may be increased by reducing the confining pressure. Incidentally, in this treatment, the confining pressure may be 0. Also, this treatment is preferably used as an auxiliary treatment of the freezing treatment.

2. Voltage Applying Step

The voltage applying step in the present disclosure is a step of applying voltage to the all solid state battery of which resistance is increased. In particular, in the present disclosure, a first voltage applying treatment, a second voltage applying treatment, and a third voltage applying treatment, are conducted.

(1) First Voltage Applying Treatment

A first voltage applying treatment is a treatment of applying voltage $V_1$ to the all solid state battery of which resistance is increased. There are no particular limitations on the method for applying the voltage, and examples thereof may include a method of applying a voltage by connecting an insulation resistance measurement device to the cathode and anode terminals. Also, as described above, a voltage is applied to a battery in the state not functioning as a battery. Accordingly, the voltage may be applied in the manner that the cathode active material layer becomes a high potential side and the anode active material layer becomes a low potential side, and vice versa.

There are no particular limitations on the value of voltage $V_1$, but it is preferably a positive number. The value of voltage $V_1$ is, for example, the voltage is 1 V or more, may be 2 V or more, may be 100 V or more, may be 500 V or more, and may be 1000 V or more. The current value to be measured becomes larger as the value of the value of voltage $V_1$ becomes larger. Meanwhile, there are no particular limitations on the upper limit of the value of voltage $V_1$; however, if an extremely high voltage is applied, there is a possibility of damaging the all solid state battery. For example, when the resistance of the all solid state battery at the time of the measurement is high enough, the current value $C_1$ becomes small even when voltage $V_1$ is set high; thus, the all solid state battery is not easily damaged. On the other hand, when the resistance of the all solid state battery at the time of the measurement is low, current value $C_1$ becomes large if voltage $V_1$ is set high; thus, the all solid state battery is easily damaged. The value of voltage $V_1$ is, for example, the value at which the current value that flows in the all solid state battery (particularly the all solid state battery judged acceptable) becomes 5 mA or less, and may be the value at which the current value becomes 3.2 mA or less.

(2) Second Voltage Applying Treatment

A second voltage applying treatment is a treatment of applying voltage $V_2$ corresponding to the reverse voltage of voltage $V_1$ after the first voltage applying treatment. For example, when a voltage is applied in the manner that the cathode active material layer becomes a high potential side and the anode active material layer becomes a low potential side in the first voltage applying treatment, a voltage is applied in the second voltage applying treatment in the manner that the cathode active material layer becomes the low potential side and the anode active material layer becomes the high potential side. Incidentally, the preferable value (absolute value) for voltage $V_2$ is in the same contents as those described for voltage $V_1$ above; thus, the descriptions herein are omitted.

There are no particular limitations on voltage $V_2$ if it is a voltage that corresponds to the reverse voltage of voltage $V_1$. Above all, voltage $V_2$ preferably satisfies $V_2 \leq -V_1/500$. For example, when the voltage of +1000 V is applied as voltage $V_1$, it is preferable to apply the voltage of −2 V or less as voltage $V_2$. The reason therefor is to easily eliminate the capacitance component generated by applying voltage $V_1$ in the all solid state battery. Voltage $V_2$ may satisfy $V_2 \leq -V_1/250$, may satisfy $V_2 \leq -V_1/200$, and may satisfy $V_2 \leq -V_1/100$. Meanwhile, voltage $V_2$ may satisfy, for example, $-V_1 \leq V_2$.

(3) Third Voltage Applying Treatment

A third voltage applying treatment is a treatment of applying voltage $V_3$ that corresponds to the reverse voltage of voltage $V_2$ after the second voltage applying treatment. For example, when a voltage is applied in the second voltage applying treatment in the manner that the cathode active material layer becomes the low potential side and the anode active material layer becomes the high potential side, a voltage is applied in the third voltage applying treatment in the manner that the cathode active material layer becomes the high potential side and the anode active material layer becomes the low potential side. Incidentally, the preferable value for voltage $V_3$ is in the same contents as those described for voltage $V_1$ above; thus, the descriptions herein are omitted.

There are no particular limitations on voltage $V_3$ if it is a voltage that corresponds to the reverse voltage of voltage $V_2$. Above all, voltage $V_3$ may, for example, satisfy $0.5V_1 \leq V_3$, may satisfy $0.7V_1 \leq V_3$, and may satisfy $0.9V_1 \leq V_3$. Meanwhile, voltage $V_3$ may, for example, satisfy $V_3 \leq 1.5V_1$, may satisfy $V_3 \leq 1.3V_1$, and may satisfy $V_3 \leq 1.1V_1$. When voltage $V_3$ is closer to voltage $V_1$, the credibility of the test improves more.

Incidentally, in the present disclosure, at least three times of voltage applying treatment: the first voltage applying treatment, the second voltage treatment, and the third voltage applying treatment, are conducted; however, an additional voltage applying treatment may be further conducted. The additional voltage applying treatment may be conducted in an arbitrary timing.

3. Judging Step

The judging step in the present disclosure is a step of judging the acceptability of the all solid state battery based on the current value measured in the voltage applying step. In particular, in the present disclosure, the acceptability of the all solid state battery is judged based on current value $C_1$ and current value $C_3$ measured when voltage $V_1$ and voltage $V_3$ are applied.

The reference for judging the acceptability may be appropriately set in accordance with the purpose of a test. For example, current value $C_1$ is regarded as current value $I_A$. Meanwhile, current value as a reference for judging the acceptability is regarded as current value $I_B$. When the ratio of $I_A$ to $I_B$ ($I_A/I_B$) is less than the reference value, it can be judged assumably acceptable, and when the ratio is the reference value or more, it can be judged unacceptable. Next, the acceptability is judged in the same manner but regarding current value $C_3$ as current value $I_B$. For example, when both current values $C_1$ and $C_3$ are judged assumably acceptable, it can be judged truly acceptable. There are no particular limitations on the reference value of $I_A/I_B$; for example, it may be 1.5 or more, and it may be 2 or more.

4. All Solid State Battery

There are no particular limitations on the all solid state battery in the present disclosure if it is a battery including a solid electrolyte layer; however, it is preferably a battery using metal ions as the charge carrier. In particular, the all solid state battery in the present disclosure is preferably an all solid lithium ion battery. Also, the all solid state battery may be a primary battery and may be a secondary battery, but preferably a secondary battery among them, so as to be repeatedly charged and discharged, and useful as a car-mounted battery, for example. Also, the all solid state battery may be a battery comprising one power generating element including a cathode active material layer, a solid electrolyte layer, and an anode active material layer, and may be a battery comprising a plurality of the power generating element. In the latter case, the all solid state battery may be a battery in which a plurality of the power generating element are connected in parallel, and may be a battery in which a plurality of the power generating element are connected in series. Also, adjacent power generating elements may share current collectors.

(1) Solid Electrolyte Layer

The solid electrolyte layer is a layer containing a solid electrolyte, and may further contain a binder. Examples of the solid electrolyte may include an inorganic solid electrolyte. Examples of the inorganic solid electrolyte may include a sulfide solid electrolyte, an oxide solid electrolyte, a nitride solid electrolyte, and a halide solid electrolyte. Also, the inorganic solid electrolyte preferably has Li ion conductivity for example.

Examples of the sulfide solid electrolyte may include a solid electrolyte containing a Li element, an X element (X is at least one kind of P, Si, Ge, Sn, B, Al, Ga, and In), and a S element. Also, the sulfide solid electrolyte may further contain a halogen element. Also, examples of the oxide solid electrolyte may include a solid electrolyte containing a Li element, a Y element (Y is at least one kind of Nb, B, Al, Si, P, Ti, Zr, Mo, W, and S), and an O element. Also, examples of the nitride solid electrolyte may include $Li_3N$, and examples of the halide solid electrolyte may include LiCl, LiI, and LiBr.

Examples of a binder used in the solid electrolyte layer may include a rubber-based binder such as butyrin rubber (BR) and styrene butadiene rubber (SBR); and a fluoride-based binder such as polyvinylidene fluoride (PVdF).

The thickness of the solid electrolyte layer is, for example, 0.1 μm or more, may be 1 μm or more, and may be 10 μm or more. Meanwhile, the thickness of the solid electrolyte layer is, for example, 300 μm or less, and may be 100 μm or less.

(2) Cathode Active Material Layer

The cathode active material layer is a layer containing a cathode active material, and may further contain at least one of a solid electrolyte, a conductive material, and a binder.

Examples of the cathode active material may include an oxide active material and a sulfur active material. Also, the cathode active material is, for example, preferably capable of reacting with a Li ion. Examples of the oxide active material may include a rock-salt-bed-type active material such as $LiCoO_2$, $LiMnO_2$, $LiNiO_2$, $LiVO_2$, and $LiNi_{1/3}Co_{1/3}Mn_{1/3}O_2$; a spinel type active material such as $LiMn_2O_4$, $Li_4Ti_5O_{12}$, and $Li(Ni_{0.5}Mn_{1.5})O_4$; and an olivine type active material such as $LiFePO_4$, $LiMnPO_4$, $LiNiPO_4$, and $LiCoPO_4$. Also, a coating layer containing a Li ion conductive oxide may be formed on the surface of the cathode active material. The reason therefor is to inhibit the reaction of the cathode active material with a solid electrolyte.

Examples of the conductive material used in the cathode active material may include a carbon material such as acetylene black (AB) and Ketjen black (KB). Also, the solid electrolyte and the binder used in the cathode active material are in the same contents as those described in the column of the solid electrolyte described above; thus, the descriptions herein are omitted.

The thickness of the cathode active material layer is, for example, 0.1 μm or more, may be 1 μm or more, and may be 10 μm or more. Meanwhile, the thickness of the cathode active material layer is, for example, 300 μm or less, and may be 100 μm or less. Also, examples of the cathode current collector for collecting current of the cathode active material layer may include a SUS foil and an Al foil.

(3) Anode Active Material Layer

The anode active material layer is a layer containing an anode active material, and may further contain at least one of a solid electrolyte, a conductive material, and a binder.

Examples of the anode active material may include a metal active material and a carbon active material. Also, the anode active material is, for example, preferably capable of reacting with a Li ion. Examples of the metal active material may include a simple substance of metal, a metal alloy, and a metal oxide. Examples of the metal element included in the metal active material may include Li, Si, Sn, In, and Al. The metal alloy is preferably an alloy containing the metal element as a main component. Examples of the carbon active material may include mesocarbon microbeads (MCMB), highly oriented pyrolytic graphite (HOPG), hard carbon, and soft carbon.

The solid electrolyte, the conductive material, and the binder used in the anode active material are in the same contents as those described in the columns of the solid electrolyte and the cathode active material layer above; thus, the descriptions herein are omitted.

The thickness of the anode active material is, for example, 0.1 μm or more, may be 1 μm or more, and may be 10 μm or more. Meanwhile, the thickness of the anode active material layer is, for example, 300 μm or less, and may be 100 μm or less. Also, examples of the anode current collector for collecting current of the anode active material layer may include a SUS foil and a Cu foil.

B. Method for Producing all Solid State Battery

The method for producing an all solid state battery of the present disclosure comprises a preparing step of preparing an all solid state battery, and a testing step of testing the all solid state battery using the above described testing method.

According to the present disclosure, the all solid state battery is tested using the above described testing method, and thus the all solid state battery with higher safety can be obtained.

1. Preparing Step

The preparing step is a step of preparing an all solid state battery (all solid state battery before the testing step). There are no particular limitations on the method for preparing the all solid state battery; the battery may be fabricated by one own, and may be purchased from others. In the former case, a general method for fabricating an all solid state battery may be adopted.

Figure 3A:
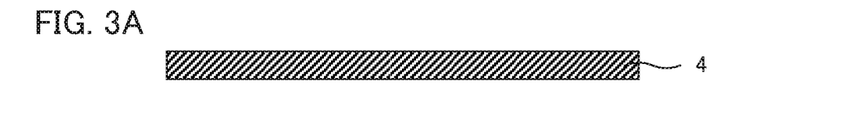
FIGS. 3A to 3F are schematic cross-sectional views illustrating an example of the preparing step in the present disclosure.
Figure 3B:
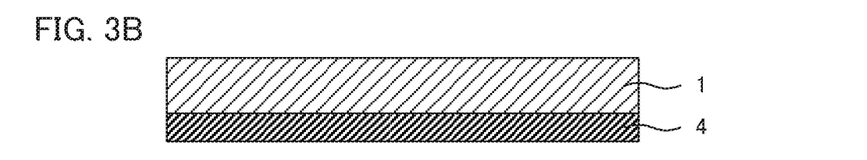
Figure 3C:
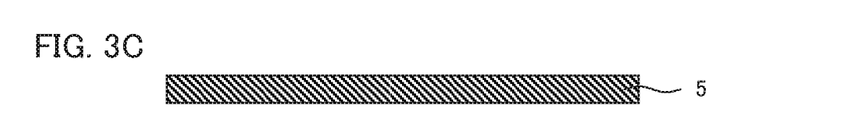
Figure 3D:
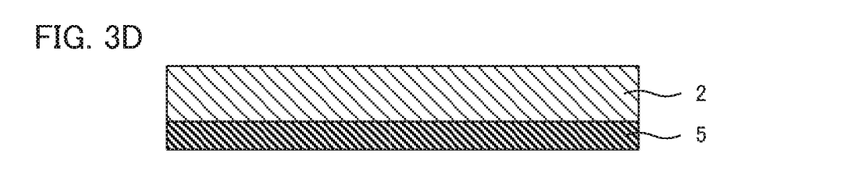
Figure 3E:
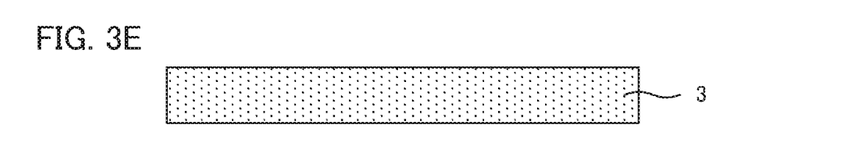
Figure 3F:
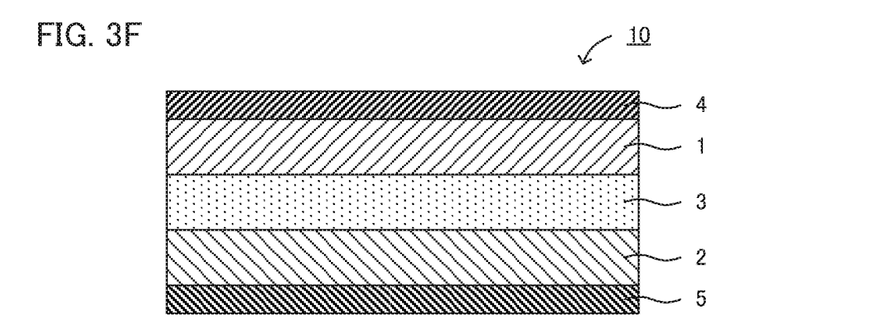

FIGS. 3A to 3F are schematic cross-sectional views illustrating an example of the preparing step in the present disclosure. First, cathode current collector 4 is prepared (FIG. 3A). Next, slurry containing at least a cathode active material is pasted on cathode current collector 4 and dried to obtain a cathode having cathode current collector 4 and cathode active material layer 1 (FIG. 3B). Next, anode current collector 5 is prepared (FIG. 3C). Next, slurry containing at least an anode active material is pasted on anode current collector 5 and dried to obtain an anode having anode current collector 5 and anode active material layer 2 (FIG. 3D). Next, slurry containing at least a solid electrolyte is pasted, dried, and pressed to form solid electrolyte layer 3 (FIG. 3E). Next, one surface of solid electrolyte layer 3 and cathode active material layer 1 of the cathode are arranged so that the both faces to each other. Next, the other surface of solid electrolyte layer 3 and anode active material layer 2 of the anode are arranged so that the both face to each other. After that, the product is pressed and thereby all solid state battery 10 is obtained (FIG. 3F).

2. Testing Step

The testing step is a step of testing the all solid state battery (all solid state battery prepared in the preparing step) using the method described in "A. Method for testing all solid state batter" above. The method for testing is in the same contents as those described above; thus the descriptions herein are omitted.

C. Method for Producing Battery Pack

The method for producing a battery pack of the present disclosure comprises: a preparing step of preparing an all solid state battery; a testing step of testing the all solid state battery using the above described method for testing an all solid state battery; and an assembling step of assembling a battery pack using a plurality of the all solid state battery judged acceptable in the testing step.

According to the present disclosure, the all solid state battery judged acceptable in the testing step is used and thus a battery pack with higher safety can be obtained. The preparing step and the testing step are in the same contents as those described in "B. Method for producing all solid state battery"; thus, the descriptions herein are omitted. Also, the assembling step is in the same manner as in the assembling step of a general battery pack. The battery pack of the present disclosure may be a battery in which a plurality of the all solid state battery are connected in parallel, and may be a battery in which a plurality of the all solid state battery are connected in series. Also, adjacent all solid state batteries may share current collectors.

Incidentally, the present disclosure is not limited to the embodiments. The embodiments are exemplification, and any other variations are intended to be included in the technical scope of the present disclosure if they have substantially the same constitution as the technical idea described in the claim of the present disclosure and offer similar operation and effect thereto.

EXAMPLES

Production Example 1

Fabrication of Cathode

A cathode mixture slurry containing: cobaltate lithium as a cathode active material, $70Li_2S-30P_2S_5$ glass ceramic as a solid active material, and polyvinylidene fluoride (PVDF) as a binder, was fabricated. The cathode mixture slurry was pasted on one surface of a SUS foil, which was as a cathode current collector, and dried to obtain a cathode having a cathode active material layer on the cathode current collector (FIGS. 3A and 3B).

Fabrication of Anode

An anode mixture slurry containing: graphite as an anode active material, $70Li_2S-30P_2S_5$ glass ceramic as a solid active material, and PVDF as a binder, was fabricated. The anode slurry was pasted onto both surfaces of a SUS foil, which was as an anode current collector, and dried to obtain an anode having the anode active material layer respectively on the both surfaces of the anode current collector (FIGS. 3C and 3D).

Fabrication of Solid Electrolyte Layer

A solid electrolyte mixture slurry containing: 70Li$_2$S-30P$_2$S$_5$ glass ceramic as a solid electrolyte, and butadiene rubber (BR) as a binder, was fabricated. The solid electrolyte mixture slurry was pasted, dried, and pressurized to obtain a solid electrolyte layer (FIG. 3E).

Fabrication of Evaluation Cell

An evaluation cell (without foreign substance) was obtained by arranging the cathode on one surface of the solid electrolyte layer, arranging the anode on the other surface of the solid electrolyte layer, and applying pressure to the product (FIG. 3F). Incidentally, the thickness of the solid electrolyte layer was 30 μm.

Production Example 2

Figure 4:
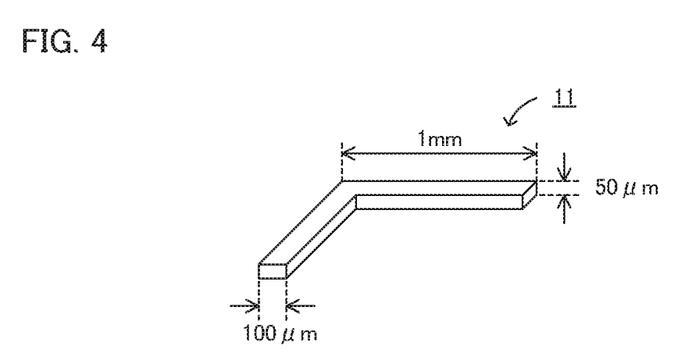
FIG. 4 is a schematic perspective view explaining a foreign substance in the present disclosure.

As illustrated in FIG. 4, SUS304 foreign substance 11 (conductive foreign substance) in L shape was prepared. An evaluation cell (with foreign substance) was obtained in the same manner as in Production Example 1, except that the foreign substance was used. In specific, the evaluation cell (with foreign substance) was obtained in the same manner as in Production Example 1, except that the foreign substance was arranged in between the solid electrolyte layer and the cathode active material layer at the timing of after the fabrication of the solid electrolyte layer illustrated in FIG. 3E, and before the fabrication of the evaluation cell as illustrated in FIG. 3F. Incidentally, the foreign substance included in the evaluation cell was present in the state not penetrating the solid electrolyte layer.

Reference Example 1

A confining pressure of 10 MPa was applied to the evaluation cell (without foreign substance) obtained in Production Example 1 in the thickness direction. Next, the evaluation cell confined was placed still inside a box made of styrene foam. Next, liquid nitrogen was injected into the box so that the evaluation cell was completely soaked. Incidentally, when the liquid nitrogen decreased, the liquid was injected appropriately in addition. Thereby, the temperature of the evaluation cell was dropped to −190° C., and the cell was frozen. Incidentally, the temperature of the evaluation cell was measured by sticking a T-shaped thermocouple to the surface of the cell.

Resistance Measurement

The resistance between the cathode and anode terminals in the frozen evaluation cell (without foreign substance) was measured using a digital multi meter (34410A from Agilent). The resistance ($\Omega \cdot cm^2$) was determined by the obtained resistance multiplied by the facing are (1000 cm$^2$) of the cathode active material layer and the anode active material layer. As the result, the resistance of the evaluation cell exceeded the limit of the measurement (1.2*10$^{17}$ $\Omega \cdot cm^2$).

Current Measurement

An insulation resistance meter (8340A, ULTRA HIGH RESISTANCE METER from ADCMT) was connected to the cathode and anode terminals of the frozen evaluation cell (without foreign substance), and applied 1000 V thereto to measure the current value $I_1$. As the result, the current value $I_1$ was 9.8*10$^{-9}$ mA. Meanwhile, the temperature of the evaluation cell (with foreign substance) obtained in Production Example 2 was dropped to −190° C. in the same manner as above, and the cell was frozen. Likewise, the current value $I_2$ of the frozen evaluation cell (with foreign substance) was measured. As the result, the current value $I_2$ was 6.3 mA. Here, when whether $I_2/I_1 \geq 1.5$ is satisfied is made the criterion for judging the possibility of foreign substance detection, the detection of foreign substance was possible in Reference Example 1.

Reference Examples 2 to 4

A resistance measurement and a current measurement were conducted in the same manner as in Reference Example 1 except that the voltage applied and the temperature of the frozen evaluation cell were changed to the conditions shown in Table 1.

TABLE 1

| | Reference Example 1 | Reference Example 2 | Reference Example 3 | Reference Example 4 |
|---|---|---|---|---|
| Temperature (° C.) | −190 | −190 | −140 | −140 |
| Resistance value ($\Omega \cdot cm^2$) cell w/o foreign substance | 1.2 * 10$^{17}$ or more | 1.2 * 10$^{17}$ or more | 3.2 * 10$^8$ | 3.2 * 10$^8$ |
| Voltage applied (V) | 1000 | 2 | 1000 | 2 |
| Currency (mA) w/o foreign substance | 9.8 * 10$^{-9}$ | 0.1 * 10$^{-9}$ | 3.2 | 0.0065 |
| w/ foreign substance | 6.3 | 0.013 | 6.3 | 0.013 |
| Detection of foreign substance | Possible | Possible | Possible | Possible |

As shown in Table 1, in Reference Examples 1 to 4, presence of defect causing short circuit was detected with high accuracy by increasing the resistance of the all solid state batteries to be 3.2*10$^8$ $\Omega \cdot cm^2$ or more. Incidentally, difficulty of the detection in the evaluation cell fabricated in Production Example 2 was high since the foreign substance was present in the state not penetrating the solid electrolyte layer. Accordingly, if difficulty of the detection is comparatively low (such as the detection of presence of minute short circuit), it is unnecessary to increase the resistance of the all solid state battery to the level of Reference Examples 1 to 4.

Production Example 3

An evaluation cell (with foreign substance) was obtained in the same manner as in Production Example 2 except that the foreign substance was brought into the state penetrating the solid electrolyte layer. Incidentally, a part of the foreign substance was in point-contact with the cathode active material, and a minute short circuit was caused.

Reference Example 5

A resistance measurement and a current measurement were conducted in the same manner as in Reference Example 1 except that the evaluation cell (with foreign substance) obtained in Production Example 3 was used instead of the evaluation cell (with foreign substance) obtained in Production Example 2, the temperature of the frozen cell was changed to −90° C., and the voltage applied was changed to 2 V.

TABLE 2

|  | Reference Example 5 |
|---|---|
| Temperature (° C.) | −90 |
| Resistance value (Ω · cm$^2$) | 3.2 * 10$^5$ |
| X-cell w/o foreign substance |  |
| Voltage applied (V) | 2 |
| Currency  w/o foreign substance (mA)  w/ foreign substance | 5.8  10 |
| Detection of minute short circuit | Possible |

As shown in Table 2, in Reference Example 5, presence of minute short circuit was detected with high accuracy by increasing the resistance of the all solid state batteries.

Example 1

A confining pressure of 10 MPa was applied to the evaluation cell (with foreign substance) obtained in Production Example 2 in the thickness direction. Next, the evaluation cell confined was placed still inside a box made of styrene foam. Next, liquid nitrogen was injected into the box so that the evaluation cell was completely soaked. Incidentally, when the liquid nitrogen decreased, the liquid was injected appropriately in addition. Thereby, the temperature of the evaluation cell was dropped to −190° C., and the cell was frozen. Incidentally, the temperature of the evaluation cell was measured by sticking a T-shaped thermocouple to the surface of the cell.

Resistance Measurement

The resistance between the cathode and anode terminals in the frozen evaluation cell (with foreign substance) was measured using a digital multi meter (34410A from Agilent. The resistance (Ω·cm$^2$) was determined by the obtained resistance multiplied by the facing are (1000 cm$^2$) of the cathode active material layer and the anode active material layer.

Current Measurement

An insulation resistance meter (8340A, ULTRA HIGH RESISTANCE METER from ADCMT) was connected to the cathode and anode terminals of the frozen evaluation cell (with foreign substance), and +1000 V was applied thereto for the first voltage applying treatment, −1000 V was applied thereto for the second voltage applying treatment, and +1000 V was applied thereto for the third voltage applying treatment, to measure the current value $C_1$ in the first voltage applying treatment and the current value $C_3$ in the third voltage applying treatment. The effect of improvement in the detection accuracy was evaluated based on the criterion for judgement as follows:

<Criterion for Judgement>
S: $0.9 \leq C_3/C_1$;
A: $0.8 \leq C_3/C_1 < 0.9$;
B: $0.5 \leq C_3/C_1 < 0.8$; and
C: $C_3/C_1 < 0.5$.

Examples 2 to 9 and Comparative Examples 1 to 3

A resistance measurement and a current measurement were conducted in the same manner as in Example 1 except that the conditions for applying voltage were changed to the conditions as shown in Table 3 and Table 4.

TABLE 3

|  | Example 1 | Example 2 | Example 3 | Example 4 | Example 5 | Example 6 |
|---|---|---|---|---|---|---|
| Temperature (° C.) | −190 | −190 | −190 | −190 | −190 | −190 |
| Resistance value (Ω · cm2) | 2.0 * 10$^9$ | 2.0 * 10$^9$ | 2.0 * 10$^9$ | 2.0 * 10$^9$ | 2.0 * 10$^9$ | 2.0 * 10$^9$ |
| X-cell with foreign substance |  |  |  |  |  |  |
| Voltage applied $V_1$(V) | +1000 | +1000 | +1000 | +500 | +500 | +500 |
| Voltage applied $V_2$(V) | −1000 | −4 | −3.5 | −500 | −2 | −1.5 |
| Voltage applied $V_3$(V) | +1000 | +1000 | +1000 | +500 | +500 | +500 |
| Currency  $C_1$ (μA) | 10.1 | 10.0 | 10.0 | 5.1 | 5.2 | 5.0 |
| $C_3$ (μA) | 10.0 | 9.2 | 8.0 | 5.1 | 5.1 | 4.0 |
| Improvement in detection accuracy | S | S | A | S | S | A |

TABLE 4

|  | Example 7 | Example 8 | Example 9 | Comparative Example 1 | Comparative Example 2 | Comparative Example 3 |
|---|---|---|---|---|---|---|
| Temperature (° C.) | −190 | −190 | −190 | −190 | −190 | −190 |
| Resistance value (Ω · cm2) | 2.0 * 10$^9$ | 2.0 * 10$^9$ | 2.0 * 10$^9$ | 2.0 * 10$^9$ | 2.0 * 10$^9$ | 2.0 * 10$^9$ |
| X-cell with foreign substance |  |  |  |  |  |  |
| Voltage applied $V_1$(V) | +100 | +100 | +100 | +1000 | +500 | +100 |
| Voltage applied $V_2$(V) | −100 | −0.4 | −0.35 | +1000 | +500 | +100 |
| Voltage applied $V_3$(V) | +100 | +100 | +100 | +1000 | +500 | +100 |
| Currency  $C_1$ (μA) | 1.0 | 1.0 | 1.0 | 10.0 | 5.1 | 1.0 |
| $C_3$ (μA) | 1.0 | 0.9 | 0.8 | 4.9 | 2.4 | 0.4 |
| Improvement in detection accuracy | S | S | A | C | C | C |

As shown in Table 3 and Table 4, the change in current value $C_1$ and current value $C_3$ was small in Examples 1 to 9. This is presumably because the capacitance component generated in the all solid state battery in the first voltage applying treatment was eliminated by conducting the specific second voltage applying treatment. Incidentally, the effect of improvement in detection accuracy in Examples 3, 6, and 9 were slightly weaker than other Examples; however, it was in the level tolerable to a practical usage. On the other hand, the change in current value $C_1$ and current value $C_3$ was large in Comparative Examples 1 to 3. Accordingly, it was suggested that the judgement of acceptability would be difficult in some cases when the voltage was applied a plurality of times since the current value decreases due to the increase in the resistance of the all solid state battery.

REFERENCE SIGNS LIST 1 cathode active material layer
2 anode active material layer
3 solid electrolyte layer
4 cathode current collector
5 anode current collector
10 all solid state battery
11 foreign substance

What is claimed is:

1. A method for testing an all solid state battery, the method comprising steps of:
    a resistance increasing step of increasing resistance of an all solid state battery to $3.2*10^8$ $\Omega \cdot cm^2$ or more;
    a voltage applying step of applying voltage to an all solid state battery of which the resistance is increased; and
    a judging step of judging acceptability of the all solid state battery based on a current value measured in the voltage applying step; and
    the voltage applying step includes a first voltage applying treatment of applying voltage $V_1$, a second voltage applying treatment of applying voltage $V_2$ corresponding to the reverse voltage of the voltage $V_1$ after the first voltage applying treatment, and a third voltage applying treatment of applying voltage $V_3$ corresponding to the reverse voltage of the voltage $V_2$ after the second voltage applying treatment; and
    in the judging step, acceptability of the all solid state battery is judged based on current value $C_1$ and current value $C_3$ measured when the voltage $V_1$ and the voltage $V_3$ are applied.

2. The method for testing an all solid state battery according to claim 1, wherein the resistance of the all solid state battery is increased by a freezing treatment in the resistance increasing step.

3. A method for testing an all solid state battery, the method comprising steps of:
    a resistance increasing step of increasing resistance of an all solid state battery by a freezing treatment;
    a voltage applying step of applying voltage to an all solid state battery of which the resistance is increased; and
    a judging step of judging acceptability of the all solid state battery based on a current value measured in the voltage applying step; and
    the voltage applying step includes a first voltage applying treatment of applying voltage $V_1$, a second voltage applying treatment of applying voltage $V_2$ corresponding to the reverse voltage of the voltage $V_1$ after the first voltage applying treatment, and a third voltage applying treatment of applying voltage $V_3$ corresponding to the reverse voltage of the voltage $V_2$ after the second voltage applying treatment; and
    in the judging step, acceptability of the all solid state battery is judged based on current value $C_1$ and current value $C_3$ measured when the voltage $V_1$ and the voltage $V_3$ are applied.

4. The method for testing an all solid state battery according to claim 1, wherein the voltage $V_1$ and the voltage $V_2$ satisfy $V_2 \leq -V_1/250$.

5. The method for testing an all solid state battery according to claim 1, wherein the voltage $V_1$ and the voltage $V_3$ satisfy $0.9V_1 \leq V_3 \leq 1.1V_1$.

6. A method for testing an all solid state battery, the method comprising steps of:
    a preparing step of preparing an all solid state battery; and
    a testing step of testing the all solid state battery using the method for testing an all solid state battery according to claim 1.

7. A method for producing a battery pack, the method comprising steps of:
    a preparing step of preparing an all solid state battery;
    a testing step of testing the all solid state battery using the method for testing an all solid state battery according to claim 1; and
    an assembling step of assembling a battery pack using a plurality of the all solid state battery judged acceptable in the testing step.

* * * * *